(12) United States Patent
Gambino et al.

(10) Patent No.: US 9,716,010 B2
(45) Date of Patent: Jul. 25, 2017

(54) HANDLE WAFER

(71) Applicant: INTERNATIONAL BUSINESS MACHINES CORPORATION, Armonk, NY (US)

(72) Inventors: Jeffrey P. Gambino, Westford, VT (US); Kenneth F. McAvey, Jr., Winooski, VT (US); Charles F. Musante, Burlington, VT (US); Bruce W. Porth, Jericho, VT (US); Anthony K. Stamper, Williston, VT (US); Timothy D. Sullivan, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 116 days.

(21) Appl. No.: 14/077,848

(22) Filed: Nov. 12, 2013

(65) Prior Publication Data

US 2015/0132527 A1    May 14, 2015

(51) Int. Cl.
*H01L 21/304*    (2006.01)
*H01L 21/683*    (2006.01)

(52) U.S. Cl.
CPC ........ *H01L 21/304* (2013.01); *H01L 21/6835* (2013.01); *H01L 2221/6834* (2013.01); *H01L 2221/68327* (2013.01); *Y10T 428/219* (2015.01)

(58) Field of Classification Search
CPC ............... H01L 21/304; H01L 21/6836; H01L 21/67346; H01L 21/67; H01L 21/6835; H01L 2221/6834; H01L 2221/68327; Y10T 428/219

USPC ........................................................ 269/287
See application file for complete search history.

(56) References Cited

U.S. PATENT DOCUMENTS

| 5,703,493 | A | 12/1997 | Weeks et al. |
| 6,729,875 | B2 | 5/2004 | Goodman |
| 7,070,660 | B2 | 7/2006 | Keeton et al. |
| 7,601,224 | B2 | 10/2009 | Foree |
| 7,670,434 | B2 | 3/2010 | Shimizu et al. |
| 2002/0134503 | A1* | 9/2002 | Hussinger et al. ........ 156/331.4 |
| 2004/0242003 | A1* | 12/2004 | Murayama .................... 438/690 |
| 2010/0194014 | A1* | 8/2010 | Huang et al. ................. 269/287 |

(Continued)

FOREIGN PATENT DOCUMENTS

| EP | 339279 B1 | 11/1989 |
| JP | 200426610 | 1/2004 |
| JP | 2004266104 | 9/2004 |

(Continued)

OTHER PUBLICATIONS

Amazon.com "Round Glass Tabletop Ashtray", Jun. 12, 2010, https://web.archive.org/web/20100612151800/http://www.amazon.com/KegWorks-Round-Glass-Tabletop-Ashtray/dp/B002THN6P8.*

(Continued)

*Primary Examiner* — Aaron Austin
*Assistant Examiner* — Michael Zhang
(74) *Attorney, Agent, or Firm* — David Cain; Andrew M. Calderon; Roberts Mlotkowski Safran Cole & Calderon, P.C.

(57) ABSTRACT

A handle wafer which prevents edge cracking during a thinning process and method of using the handle wafer for grinding processes are disclosed. The handle wafer includes a body portion with a bottom surface. A square edge portion is provided about a circumference of the bottom surface.

12 Claims, 4 Drawing Sheets

(56) References Cited

U.S. PATENT DOCUMENTS

2011/0140244 A1* 6/2011 Schwarzenbach H01L 21/02032
                                                    257/618
2011/0215071 A1* 9/2011 Mitrovic ............. C23C 16/4585
                                                    216/37

FOREIGN PATENT DOCUMENTS

| JP | 2007280974 | 10/2007 |
| JP | 2010239020 | 10/2010 |
| JP | 2012064735 | 3/2012 |
| JP | 2012069635 | 4/2012 |
| JP | 2013131614 A * | 7/2013 |
| TW | 201327714 A | 7/2013 |
| WO | 2013094491 | 6/2013 |
| WO | WO 2013094491 A1 * | 6/2013 |

OTHER PUBLICATIONS

Bai, D. et al., "Edge Protection of Temporarily Bonded Wafers during Backgrinding", ECS Transactions, vol. 18, No. 1, 2009, pp. 757-762.
Matthias, T. et al., "Processing of Thin Wafers Using Temporary Bonding and Debonding", EV Group Inc., Unknown Date, 1 page.
Huemoeller, R., "Thin Wafer Handling Challenges", SemiCON West—Amkor Technology, Inc, Jul. 14, 2010, 19 pages.
Unknown Author, "Semiconductor Wafer and Die Backside External Visual Inspection", JEDEC Solid State Technology Association, Mar. 2011, 18 pages.

* cited by examiner

HANDLE WAFER

FIELD OF THE INVENTION

The invention relates to a handle wafer and, more particularly, to a handle wafer which prevents edge cracking of the wafer and method of using the handle wafer for grinding processes.

BACKGROUND

Semiconductor wafer manufacturing utilizes very sophisticated wafer processing procedures and complicated manufacturing systems. In efforts to reduce the size of the semiconductor package, manufacturers have reduced component sizes including the thickness of the wafer, itself. For example, wafer thinning can be performed by a grinding method to achieve a wafer thickness on the order of 100 microns and less. These thin wafers, though, are very fragile and brittle. Of particular concern is chipping at the edges of the thinned wafers during processing (e.g., grinding).

More specifically, backside wafer thinning is required for integrated circuits for a number of reasons: smaller form factor for mobile devices, 3D stacking, and ground through silicon vias (TSVs) for power amplifiers. However, edge chipping is commonly observed during backside thinning, because the thinned wafer is especially thin at the edges due to a curvature of the bevel region.

For example, in order to perform wafer thinning, the wafer is bonded to a planar substrate. These substrates are typically planar glass or silicon substrates; whereas, the wafers have a curvature at the edges. The edges of the wafers are thus not supported during the grinding process. Once bonded to the substrate, the wafer undergoes a grinding process using conventional processes. However, the edges of wafer can crack during the grinding process due to a number of factors, including but not limited to: (i) forces applied at the edge of the wafer and (ii) the edges of the wafer being unsupported during the thinning process. That is, as the curved edges have no mechanical support, they have a tendency to crack or chip during the grinding process. A number of processes have been proposed to minimize edge chipping, including "adhesive fillet" and edge trimming; however, these processes require extra processing, which increases cost.

SUMMARY

In an aspect of the invention, a handle wafer comprises a body portion with a bottom surface. A square edge portion is provided about a circumference of the bottom surface.

In an aspect of the invention, a handle wafer comprises a body portion and a lip portion about a circumference of the body portion. A recessed portion is within confines of the lip portion.

In an aspect of the invention, a method of grinding an underside of a wafer comprises: placing adhesive on at least one of an underside of a handle wafer and the wafer; aligning the wafer within a recessed portion of the handle wafer or a square edge of the handle wafer; applying pressure to the handle wafer and the wafer such that the adhesive extends to a curved edge of the wafer at the square edge or a lip of the recessed portion of the handle wafer; and performing grinding processes to the wafer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a handle wafer and, more particularly, to a handle wafer which prevents edge cracking during a thinning process and method of using the handle wafer for grinding processes. More specifically, the present invention is directed to a handle wafer structured to reduce active wafer edge chipping through a pocket structure such as a handle wafer recess, a tapered recess, or a square edge as examples. In embodiments, these structures will provide additional or increased support to the edge of the wafer during backside processing, thereby minimizing edge chipping. Although there is extra cost associated with processing of the handle wafer, there is no additional cost with processing the device wafers which leads to reduced manufacturing cost and cycle time.

Figure 1:
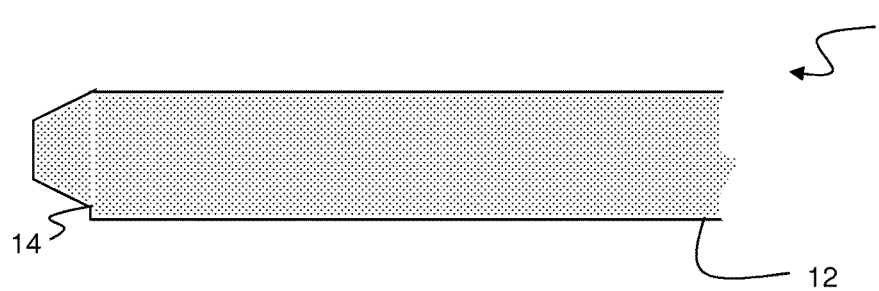
FIG. 1 shows a handle wafer in accordance with aspects of the present invention.

FIG. 1 shows a handle wafer in accordance with aspects of the present invention. In embodiments, the handle wafer 10 includes a body portion with a bottom surface 12. A square edge 14 is provided about a circumference of the bottom surface 12. In embodiments, the handle wafer 10 can be a glass substrate; although other substrates are also contemplated by the present invention, e.g., silicon. As should be understood by those of skill in the art, the square edge 14 will provide improved mechanical support to a wafer during the thinning process. In embodiments, the square edge 14 can be provided by a cutting process, grinding process or other mechanical and/or chemical process depending on the substrate material.

Figure 2A:
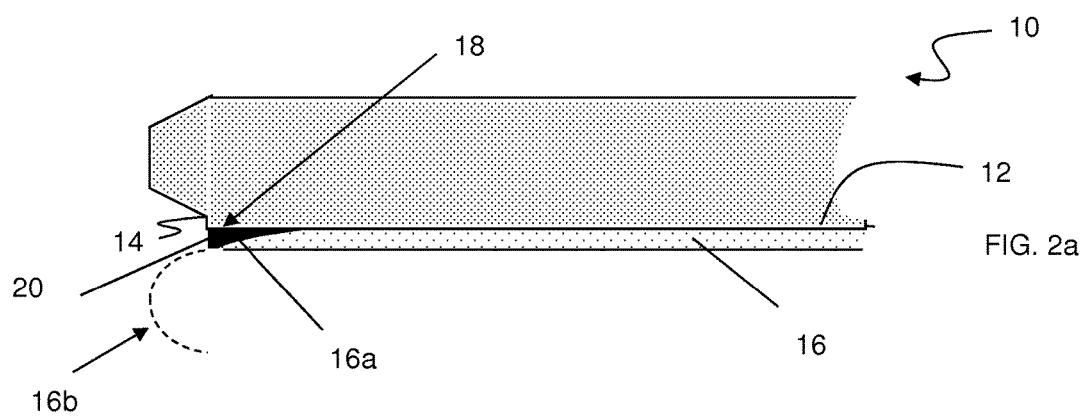
FIGS. 2a and 2b show the handle wafer of FIG. 1 bonded to a wafer in accordance with aspects of the invention.
Figure 2B:
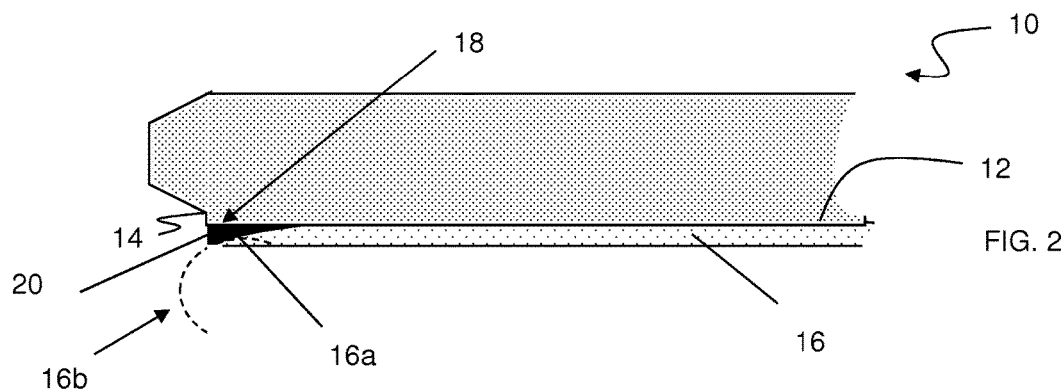

FIGS. 2a and 2b show the handle wafer 10 of FIG. 1 bonded to a wafer 16 in accordance with aspects of the invention. In FIG. 2a, the diameter of the wafer 16 is approximately the same as the diameter of the handle wafer 10; whereas, in FIG. 2b, the diameter of the handle wafer 10 is larger than a diameter of the wafer 16. In FIG. 2b, the diameter of the handle wafer 10 can be approximately a few millimeters larger than the wafer 16. This provides improved support of the the edge 16a of the device wafer 10, but may required modification of processing tools.

As shown in FIGS. 2a and 2b, reference numeral 16b represents an edge of the wafer before a grinding process. In the example of FIG. 2a, as the diameter of both the handle wafer 10 and the wafer 16 are the same, grinding or thinning processes of the wafer can be performed on standard processing tools. Also, as should be understood by those of skill in the art, as in any of the implementations of the present invention, the wafer 16 can be any standard wafer having a diameter, for example, of 150 mm, 200 mm or 300 mm.

Accordingly, the diameter of the handle wafer 10 can be based on the diameters of the wafer 16, as noted above.

In the embodiments shown in FIGS. 2a and 2b, the wafer 16 includes a curved edge 16a which is aligned with the square edge 14 of the bottom surface 12 of the wafer 10. The space between the curved edge 16a and the square edge 14 of the wafer 10 is a reduced volumetric space 18, compared to conventional handle wafers. This reduced volumetric space 18 is due to the fact that the handle wafer 10 does not have a curved surface at its edge, as in a conventional handle wafer. As one of skill in the art should understand, the reduced volumetric space 18 will accommodate adhesive 20 which provides improved support for the curved edge 16a of the wafer 16, due to less adhesive required in this space.

Figure 3A:
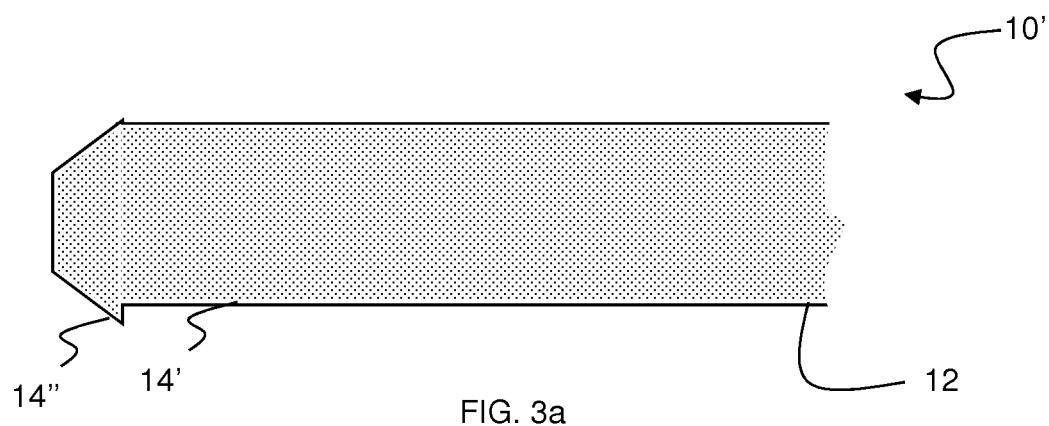
FIGS. 3a and 3b show different views of a handle wafer in accordance with additional aspects of the present invention.
Figure 3B:
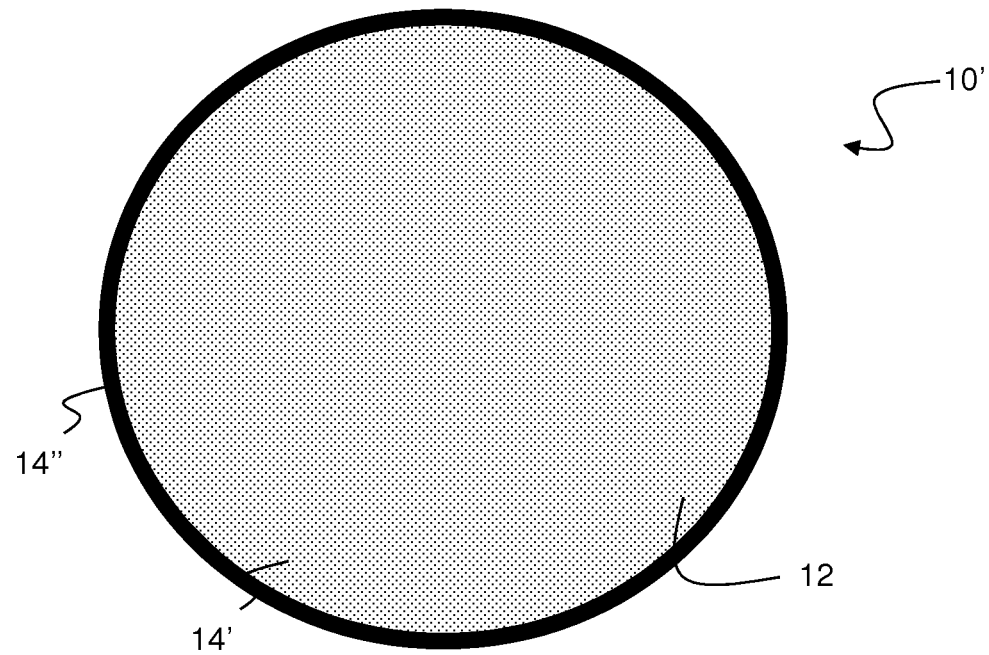

FIGS. 3a and 3b show a handle wafer in accordance with additional aspects of the present invention. In particular, FIG. 3a shows a cross sectional view of the handle wafer 10'; whereas, FIG. 3b shows a bottom view of the handle wafer 10'. In embodiments, the handle wafer 10' includes a bottom surface 12 with a recessed portion 14'. In embodiments, the handle wafer 10' can be a glass substrate; although other substrates are also contemplated by the present invention, e.g., silicon. As should be understood by those of skill in the art, the recessed portion 14' is a notch or pocket which will provide improved mechanical support to the wafer during the thinning process. In embodiments, the recessed portion 14' can be provided by a cutting process, etching process, grinding process or other mechanical and/or chemical process depending on the substrate material, which results in a lip portion 14". In embodiments, the recessed portion 14' can be formed by building the lip portion 14" on the bottom surface 12 of the handle wafer 10' about a circumference thereof. The lip portion 14" can be provided about the entirety of the circumference, and can have different configurations such as a slanted sidewall or a vertical wall forming a squared portion.

Figure 4:
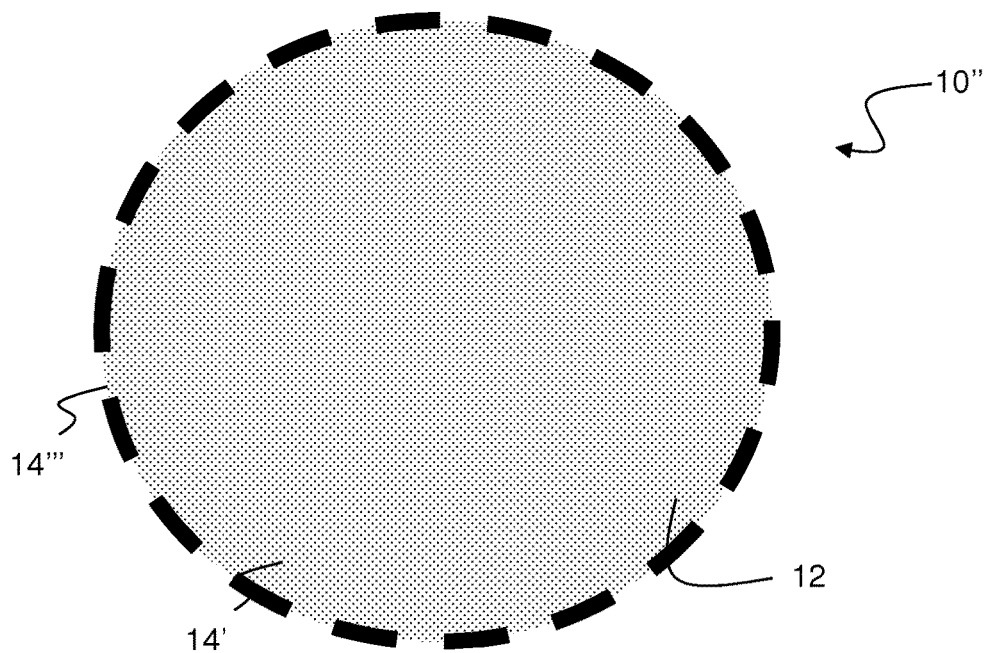
FIG. 4 shows a handle wafer in accordance with yet another aspect of the present invention.

As shown in an alternative embodiment of FIG. 4, the lip portion 14''' can be provided about intermittent portions of the circumference of the handle wafer 10", so long as adhesive is substantially retained within the recessed portion 14' by the lip portion 14'''. In embodiments, the intermittent portions can be equally spaced apart. In any of the aspects of the invention shown in FIGS. 3a, 3b and 4, the depth of the recess portion 14' can be about 1 micron to 100 microns, depending on the final thickness of the wafer. In embodiments, the depth of the recess portion 14' should not be greater than the final thickness of the wafer, as this may interfere with the grinding processes.

Figure 5:
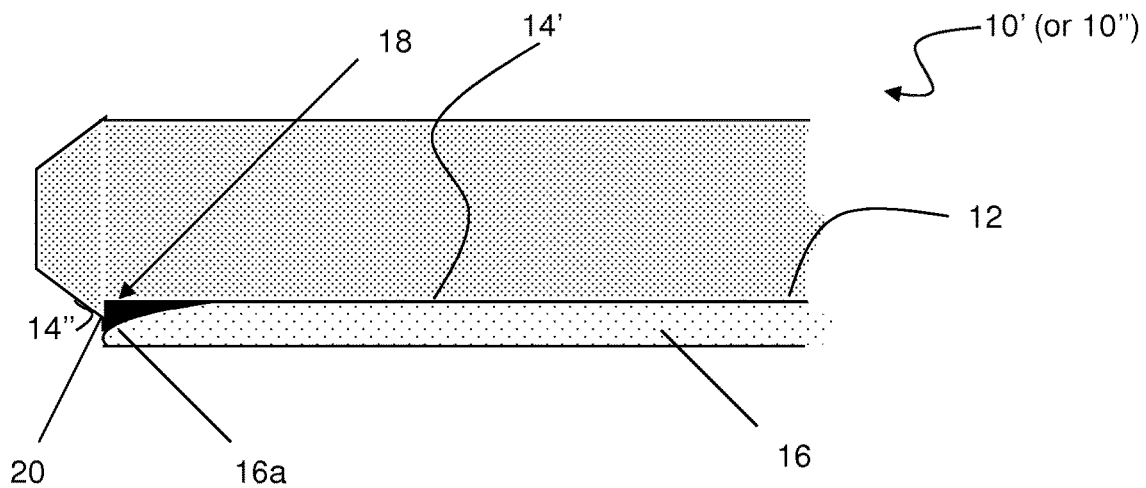
FIG. 5 shows the handle wafer of FIGS. 3a and 3b or FIG. 4 bonded to a wafer in accordance with additional aspects of the present invention.

FIG. 5 shows the handle wafer 10' of FIGS. 3a and 3b (or handle wafer 10" of FIG. 4) bonded to a wafer 16. In embodiments, the wafer 16 includes a curved edge 16a which is aligned within the recessed portion 14' of the bottom surface 12 of the wafer 10'. That is, the curved edge 16a remains within the recessed portion 14', bounded by the lip portion 14". The space between the curved edge 16a and the the lip portion 14" (or lip portion 14''') of the bottom surface 12 of the wafer 10' is a reduced volumetric space 18, compared to conventional handle wafers. This reduced volumetric space 18 is due to the fact that the handle wafer 10' does not have a curved surface at its edge, compared to a conventional handle wafer. As one of skill in the art should understand, the lip portion 14" will retain the adhesive within the recessed portion 14' (pocket or notch) thereby providing improved support for the curved edge 16a of the wafer 16.

Figure 6:
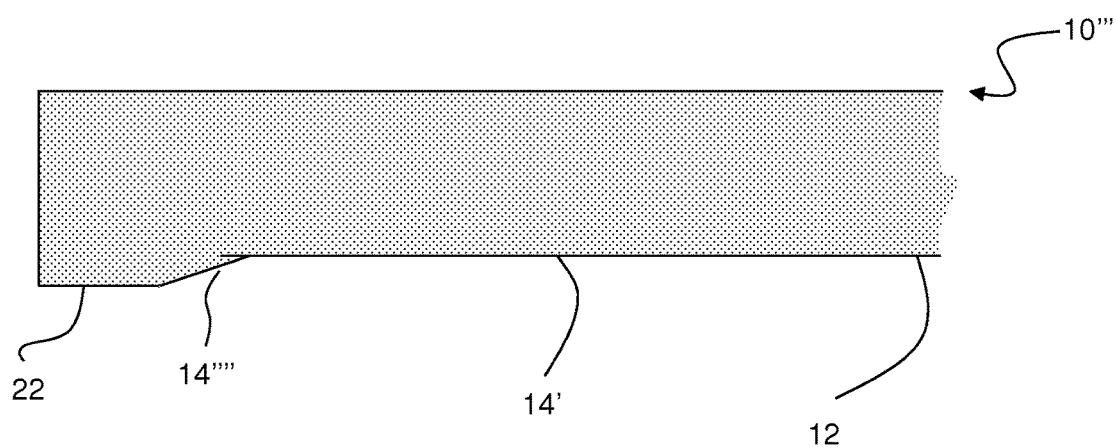
FIG. 6 shows a handle wafer in accordance with further aspects of the present invention.

FIG. 6 shows a handle wafer in accordance with additional aspects of the present invention. In particular, FIG. 6 shows a handle wafer 10''' with a recessed portion 14' formed by a lip 14''''. In this aspect of the embodiments, a buffer zone 22 is provided about the handle wafer 10''' to increase its diameter.

As previously described, the lip portion 14'''' can be provided about the entirety of the circumference or a portions thereof, and formed in the processes as already described herein with regard to FIGS. 3a, 3b and 4, e.g., mechanical processes. As previously described, the recessed portion 14' is a notch or pocket which will provide improved mechanical support during the thinning process. As in the previous aspects of the invention, the depth of the recess portion 14' can be about 1 micron to 100 microns, depending on the final thickness of the wafer 16. In embodiments, the handle wafer 10''' can be a glass substrate; although other substrates are also contemplated by the present invention, e.g., silicon.

Figure 7:
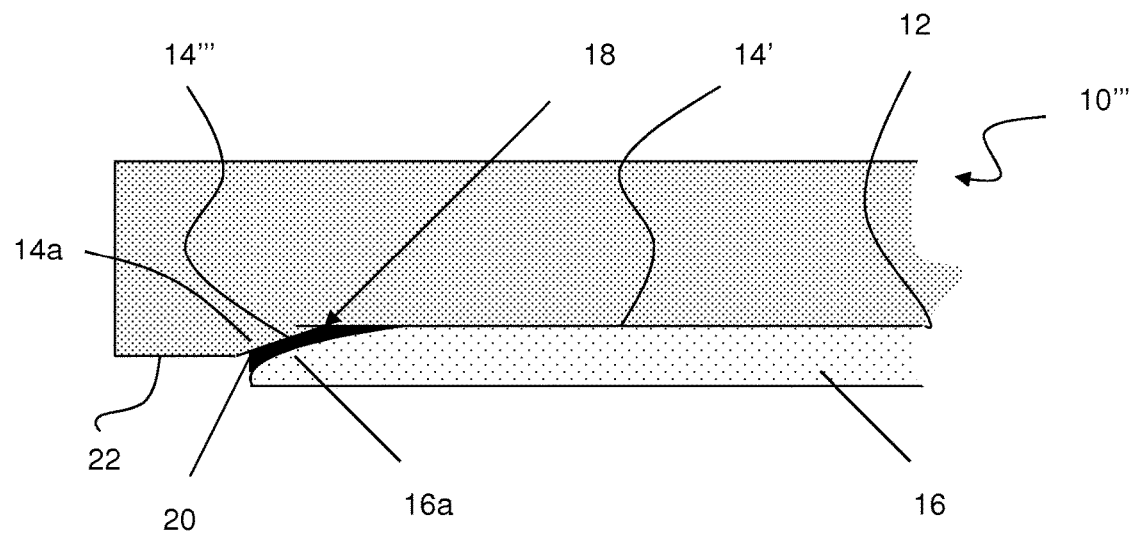
FIG. 7 shows the handle wafer of FIG. 6 bonded to a wafer in accordance with aspects of the invention.

As shown in FIG. 7, the lip portion 14''' has a slanted edge 14a which matches the profile of the curved edge 16a of the wafer 16. In this embodiment, the the curved edge 16a remains within the recessed portion 14', bounded by the lip portion 14". The space between the curved edge 16a and the lip portion 14''' of the bottom surface 12 of the wafer 10''' is a reduced volumetric space 18, compared to conventional handle wafers. This reduced volumetric space 18 is also reduced compared to the aspects of the invention shown in FIGS. 3a, 3b and 4. As one of skill in the art should understand, the lip portion 14''' will retain the adhesive within the recessed portion 14' (pocket or notch) thereby providing improved support for the curved edge 16a of the wafer 16. Also, the buffer zone 22 will ensure that adhesive 20 can be applied to the edge of the wafer 16.

A method is also provided for using the handle wafer in a grinding process. In this method, adhesive is placed on an underside of the handle wafer and/or the wafer. The wafer is then placed within the recessed portion of the handle wafer or aligned with the square edge of the handle wafer. Pressure is applied to the handle wafer and/or the wafer such that the adhesive extends to a curved edge of the wafer at the square edge or a lip of the recessed portion of the handle wafer. Grinding can then be performed to the surface of the wafer.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A handle wafer comprising:
a body portion with a recessed bottom surface forming a notch on an underside thereof;
a square edge portion about a circumference of the bottom surface,
the square edge portion forming a lip of the notch and having a first vertical surface and a horizontal surface;
a sloped wall comprising a first slope surface extending directly from the first vertical surface, leading to an outer edge of the body portion;
a second vertical surface in direct contact and leading from the first slope surface, the second vertical surface being at the outer edge of the body portion; and
a second slope surface in direct contact and leading from the second vertical surface, the second slope surface extending toward an inner portion of the body portion,
wherein relative to the bottom surface, the first slope surface is at an angle different than that of the first vertical surface and horizontal surface,
wherein the first vertical surface of the square edge is in direct contact and leading from the horizontal surface,
wherein the first slope surface and the second slope surface are sloped in different orientations, and wherein the first slope surface extends upward as it slopes away from the bottom surface and the second slope surface extends downward as it slopes away from a top surface, which is positioned on an opposing side of the bottom surface.

2. The handle wafer of claim 1, wherein the body portion is a glass or silicon substrate.

3. The handle wafer of claim 1, wherein the square edge portion is aligned with a curved edge of a wafer, which is bonded to the bottom surface of the body portion.

4. The handle wafer of claim 3, further comprising adhesive between the square edge portion and the curved edge of the wafer.

5. The handle wafer of claim 1, wherein the lip is provided about an entire circumference of the bottom surface.

6. The handle wafer of claim 1, wherein the lip is spaced intermittently about the circumference of the bottom surface.

7. The handle wafer of claim 6, wherein the intermittently spaced lip has equally spaced portions.

8. The handle wafer of claim 1, further comprising a wafer provided in the recessed portion, wherein adhesive is held within the recessed portion by the lip.

9. The handle wafer of claim 1,
wherein the first slope surface extends upward as it slopes away from the bottom surface and the second slope surface extends upwards as it slopes away from the second vertical surface towards the top surface.

10. A handle wafer comprising:
a body portion with a bottom surface, the bottom surface having a recessed portion forming a notch on an underside thereof;
a square edge portion about a circumference of the bottom surface,
wherein the body portion is a glass or silicon substrate,
wherein the square edge portion is aligned with a curved edge of a wafer, which is bonded to the bottom surface of the body portion,
wherein the square edge portion is a lip of the notch bounding the recessed portion on the bottom surface,
wherein the square edge portion has a first vertical surface and a horizontal surface, and further comprising
a sloped wall comprising a first slope surface extending directly from the vertical surface, leading to an outer edge of the body portion,
a second vertical surface in direct contact and leading from the first slope surface, the second vertical surface being at the outer edge of the body portion,
and a second slope surface in direct contact and leading from the second vertical surface, the second slope surface extending toward an inner portion of the body portion,
wherein the vertical surface of the square edge is in direct contact and leading from the horizontal surface, and,
wherein the first slope surface and the second slope surface are sloped in different orientations.

11. The handle wafer of claim 10,
wherein the first slope surface extends upward as it slopes away from the bottom surface and the second slope surface extends downward as it slopes away from a top surface, which is positioned on an opposing side of the bottom surface.

12. The handle wafer of claim 10,
wherein the first slope surface extends upward as it slopes away from the bottom surface and the second slope surface extends upwards as it slopes away from the second vertical surface towards a top surface, which is positioned on an opposing side of the bottom surface.

* * * * *